(12) United States Patent
Morisaki et al.

(10) Patent No.: US 8,440,270 B2
(45) Date of Patent: May 14, 2013

(54) FILM DEPOSITION APPARATUS AND METHOD

(75) Inventors: Eisuke Morisaki, Shiroyama-Machi (JP); Hirokatsu Kobayashi, Nirasaki (JP); Jun Yoshikawa, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 651 days.

(21) Appl. No.: 12/521,179

(22) PCT Filed: Nov. 29, 2007

(86) PCT No.: PCT/JP2007/073069
§ 371 (c)(1),
(2), (4) Date: Aug. 13, 2009

(87) PCT Pub. No.: WO2008/078500
PCT Pub. Date: Jul. 3, 2008

(65) Prior Publication Data
US 2010/0015359 A1    Jan. 21, 2010

(30) Foreign Application Priority Data
Dec. 25, 2006  (JP) .................................. 2006-348456

(51) Int. Cl.
  C23C 16/00  (2006.01)
  C23C 16/42  (2006.01)
  C23C 16/46  (2006.01)
  C23C 16/52  (2006.01)

(52) U.S. Cl.
  USPC ....... 427/591; 427/249.15; 118/725; 118/666

(58) Field of Classification Search ................. 118/725, 118/724, 666; 427/591, 249.15
See application file for complete search history.

(56) References Cited

U.S. PATENT DOCUMENTS

| | | | | | |
|---|---|---|---|---|---|
| 3,658,032 | A | * | 4/1972 | Kohler et al. ................. | 118/725 |
| 3,816,690 | A | * | 6/1974 | Mittelmann .................. | 219/663 |
| 3,964,430 | A | * | 6/1976 | Purmal ......................... | 118/725 |
| 5,653,808 | A | * | 8/1997 | MacLeish et al. ............ | 118/715 |
| 5,928,421 | A | * | 7/1999 | Yuri et al. ...................... | 117/97 |
| 6,113,984 | A | | 9/2000 | MacLeish et al. | |
| 6,299,683 | B1 | * | 10/2001 | Rupp et al. .................... | 117/88 |
| 6,331,212 | B1 | * | 12/2001 | Mezey, Sr. .................... | 118/725 |
| 7,048,802 | B2 | * | 5/2006 | Kaeppeler et al. ............ | 118/725 |

(Continued)

FOREIGN PATENT DOCUMENTS

EP  0 823 492 A2  2/1998
EP  0 823 492 A3  2/1998

(Continued)

OTHER PUBLICATIONS

Extended European Search Report issued Jan. 27, 2011, in Patent Application No. 07832784.8.

*Primary Examiner* — Jeffrie R Lund
(74) *Attorney, Agent, or Firm* — Rothwell, Figg, Ernst & Manbeck, P.C.

(57) ABSTRACT

A film deposition apparatus which comprises: a processing chamber having a space inside which serves as a vacuum space to which a film deposition gas is supplied; a substrate supporting unit which is disposed in the vacuum space and supports a substrate; a coil which inductively heats the substrate supporting unit to thereby form a film from the film deposition gas on the substrate and which has been divided into regions; and a coil control unit which controls the coil region by region.

19 Claims, 10 Drawing Sheets

U.S. PATENT DOCUMENTS

| | | | |
|---|---|---|---|
| 7,582,851 B2 * | 9/2009 | Fishman et al. | 219/660 |
| 8,042,498 B2 * | 10/2011 | Hirayama et al. | 122/476 |
| 8,328,943 B2 * | 12/2012 | Morisaki et al. | 118/724 |
| 2002/0139794 A1 * | 10/2002 | Budinger | 219/615 |
| 2006/0126700 A1 * | 6/2006 | Wilcox et al. | 373/151 |
| 2007/0101939 A1 * | 5/2007 | Sumakeris et al. | 118/724 |
| 2008/0127894 A1 * | 6/2008 | Sumakeris et al. | 118/725 |
| 2010/0015359 A1 * | 1/2010 | Morisaki et al. | 427/591 |
| 2010/0047448 A1 * | 2/2010 | Morisaki et al. | 427/248.1 |
| 2010/0092666 A1 * | 4/2010 | Morisaki et al. | 427/248.1 |

FOREIGN PATENT DOCUMENTS

| | | | |
|---|---|---|---|
| JP | 9 232275 | | 9/1997 |
| JP | 10 183353 | | 7/1998 |
| JP | 10183353 A | * | 7/1998 |
| JP | 11008204 A | * | 1/1999 |
| JP | 2004 241302 | | 8/2004 |
| JP | 2004 323900 | | 11/2004 |
| JP | 2004 342450 | | 12/2004 |
| JP | 2006 100067 | | 4/2006 |
| WO | WO 99/03308 | | 1/1999 |

* cited by examiner

*FIG.2*

| MATERIAL | Si | GaAs | SiC |
|---|---|---|---|
| BANDGAP Eg | 1.12eV | 1.43eV | 3.26eV |
| RELATIVE DIELECTRIC CONSTANT ε | 11.8 | 12.8 | 10 |
| ELECTRON MOBILITY μ | 1350 cm$^2$/Vs | 8500 cm$^2$/Vs | 1000 cm$^2$/Vs |
| DIELECTRIC BREAKDOWN ELECTRIC FIELD STRENGTH Ec | 3.0×10$^5$V/cm | 4.0×10$^5$V/cm | 2.5×10$^6$V/cm |
| SATURATED ELECTRON DRIFT VELOCITY Vs | 1.0×10$^7$ cm/s | 2.0×10$^7$ cm/s | 2.2×10$^7$ cm/s |
| THERMAL CONDUCTIVITY x | 1.5W/cmK | 0.5W/cmK | 4.9W/cmK |

FILM DEPOSITION APPARATUS AND METHOD

FIELD OF THE INVENTION

The present invention relates to a film deposition apparatus and method which performs film deposition on a substrate by using induction heating.

BACKGROUND OF THE INVENTION

An epitaxial growth method can grow on a crystal substrate a single crystal having a crystal orientation identical to that of the crystal substrate, and thus is used in various fields.

For example, the following Patent Documents 1 and 2 describe methods for manufacturing a silicon wafer by an epitaxial growth method of Si.

In the above epitaxial growth method, it is preferable that a substrate, on which a film is deposited, is heated to a temperature higher than a decomposition temperature of a source gas so that the source gas can be thermally decomposed. Accordingly, induction heating using a coil may be used to heat the substrate for example.

Patent Document 1: Japanese Patent Laid-open Application No. H9-232275
Patent Document 2: Japanese Patent Laid-open Application No. 2004-323900

However, a source gas may have a high thermal decomposition temperature. In such a case, it is required to increase a temperature of the substrate to be higher than the thermal decomposition temperature, which makes it difficult to use the induction heating for a film deposition apparatus. For example, although the induction heating using a coil provides better temperature uniformity compared to the case of using a heating unit such as a heater or the like, the induction heating using a coil may have difficulty in uniformly heating an object because a higher heating temperature is required if a gas having a high thermal decomposition temperature is employed. In addition, the temperature of the substrate may vary, for example, depending on the flow of the film deposition gas such that it decreases at the upstream gas flow side and increase at the downstream gas flow side. Moreover, in the case of induction heating, a temperature difference may occur between a central portion and a peripheral portion of a substrate supporting unit supporting a substrate.

The above-described deterioration in the temperature uniformity of the substrate leads to non-uniform film deposition. Therefore, the intra- and the inter-substrate variations in film thickness or film quality can be increased, which results in unstable film deposition.

SUMMARY OF THE INVENTION

It is, therefore, a general object of the present invention to provide a noble and useful film deposition apparatus and method which solve the above-described problems.

It is a specific object of the present invention to provide a film deposition apparatus and method which can perform uniform and stable film deposition by employing induction heating to decompose a film deposition gas having a high decomposition temperature.

In accordance with a first aspect of the present invention, there is provided a film deposition apparatus including: a processing chamber having a vacuum space thereinside and to which a film deposition gas is supplied; a substrate supporting unit which is disposed in the vacuum space and serves to support a substrate; a coil unit which serves to inductively heat the substrate supporting unit to thereby form a film from the film deposition gas on the substrate and is divided into regions; and a coil control unit which controls the coil unit region by region.

In accordance with a second aspect of the present invention, the coil control unit in the first aspect may control the coil unit region by region based on temperatures detected by the temperature detectors installed at the substrate supporting unit.

In accordance with a third aspect of the present invention, the coil control unit in the first or the second aspect may include a power control unit for controlling a power level of a high frequency power applied to each of the coil unit regions.

In accordance with a fourth aspect of the present invention, the coil control unit in any one of the first to the third aspects may include a timing control unit for controlling timing of applying a high frequency power to each of the coil unit regions.

In accordance with a fifth aspect of the present invention, the coil control unit in any one of the first to the fourth aspects may include a frequency control unit for controlling a frequency of a high frequency power applied to each of the coil unit region.

In accordance with a sixth aspect of the present invention, the coil unit in any one of the first to the fifth aspects may be divided into a plurality of coils to be arranged along a flow of the film deposition gas in the processing chamber.

In accordance with a seventh aspect of the present invention, the coil unit may be divided into a plurality of coils to be arranged concentrically in accordance with arrangement of a plurality of substrates.

In accordance with an eighth aspect of the present invention, there is provided a film deposition method including the steps of: supplying a film deposition gas to a substrate supported by a substrate supporting unit installed inside a processing chamber; and inductively heating the substrate supporting unit by dividing a coil unit into a plurality of regions and controlling each of the divided regions separately to perform an epitaxial growth on the substrate.

In accordance with a ninth aspect of the present invention, the coil unit in the eighth aspect may be controlled based on temperatures detected by temperature detectors installed at the substrate supporting unit.

In accordance with a tenth aspect of the present invention, a power level of a high frequency power applied to each of the divided regions in the eighth or ninth aspect may be controlled.

In accordance with an eleventh aspect of the present invention, a timing of applying a high frequency power to each of the divided regions in any one of the eighth to the tenth aspects may be controlled.

In accordance with a twelfth aspect of the present invention, a frequency of a high frequency power applied to each of the divided regions in any one of the eighth to the eleventh aspects may be controlled.

In accordance with a thirteenth aspect of the present invention, the coil unit in any one of the eighth to the twelfth aspects may be divided into the regions in accordance with a flow of the film deposition gas in the processing chamber.

In accordance with a fourteenth aspect of the present invention, the coil unit in any one of the eighth to the twelfth aspects may be divided into the regions such that the regions are arranged concentrically in accordance with arrangement of a plurality of substrates.

In accordance with a fifteenth aspect of the present invention, in performing the epitaxial growth in any one of the eighth to the fourteenth aspects, a film mainly made of Si and C may be formed on the substrate by using the film deposition gas.

In accordance with a sixteenth aspect of the present invention, the film deposition gas in the fifteenth aspect may include a gas represented by $C_xH_y$, wherein x and y are integers.

In accordance with a seventeenth aspect of the present invention, in performing the epitaxial growth in any one of the eighth to the sixteenth aspects, the substrate supporting unit may be inductively heated to heat the substrate to a temperature higher than or equal to 1200° C.

Effects of the Invention

In accordance with the present invention, it is possible to provide a film deposition apparatus and method which can perform uniform and stable film deposition by employing induction heating to decompose a film deposition gas having a high decomposition temperature.

BRIEF DESCRIPTION OF THE DRAWINGS

FIG. 2 compares characteristics of semiconductor materials.

DETAILED DESCRIPTION OF EMBODIMENTS

Figure 1:
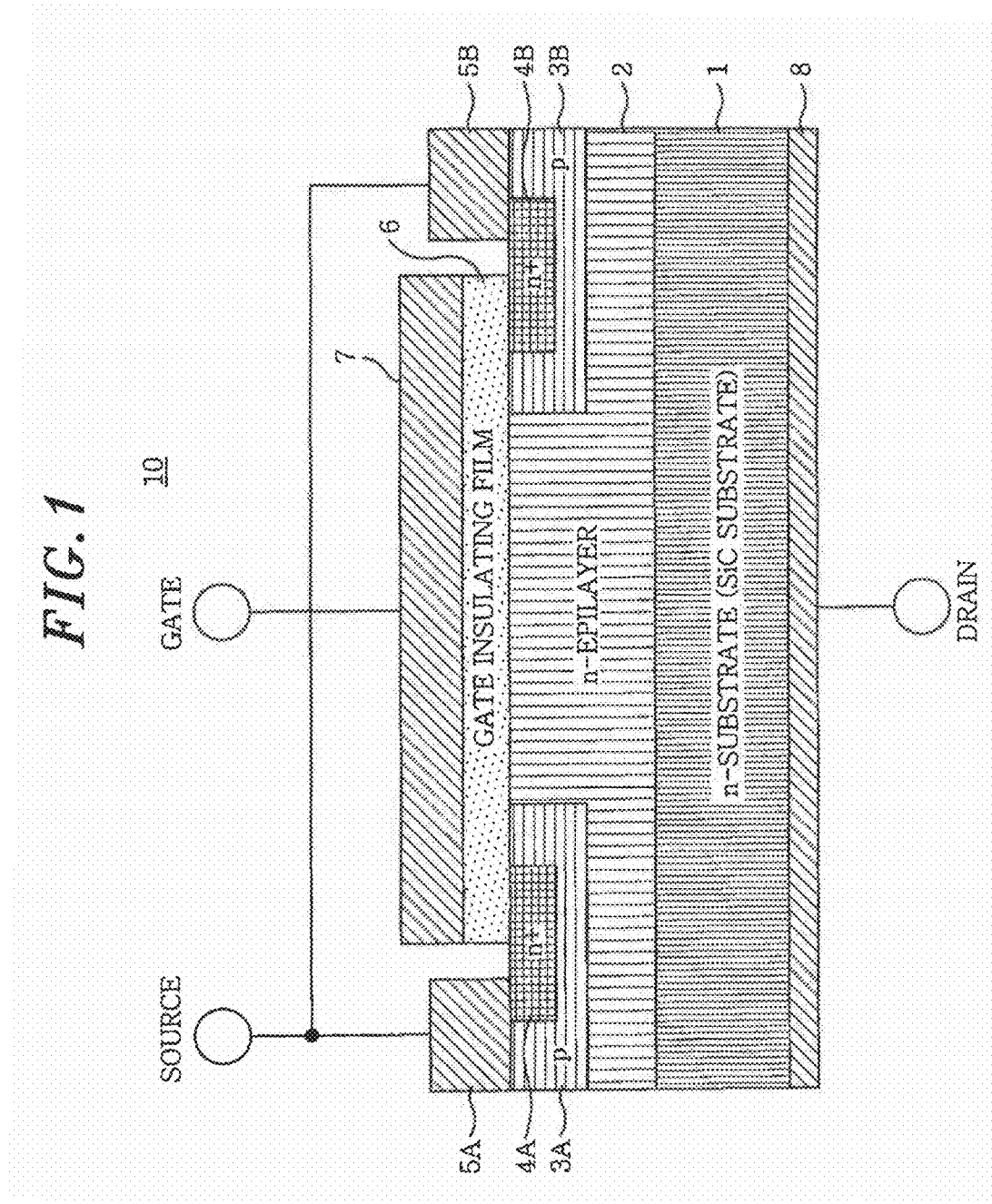
FIG. 1 is a cross sectional view showing an example of a semiconductor device manufactured by an epitaxial growth method.

Hereinafter, embodiments of the present invention will be explained with reference to the accompanying drawings. Throughout the drawings, like reference numerals are used for like or corresponding parts, and redundant description thereof will be omitted. Further, the drawings do not intend to specify a relative ratio between members or components or widths between various layers, and specific widths or dimensions should be determined by those who skilled in the art in accordance with the embodiments of the present invention without being limited to the following examples. FIG. 1 shows an example of a configuration of a semiconductor device (metal oxide semiconductor (MOS) transistor) manufactured by using an epitaxial growth method.

Referring to FIG. 1, a semiconductor device 10 includes a substrate 1 made of an n-type silicon carbide semiconductor (hereinafter, referred to as "SiC") and an n-type SiC layer 2 (n-type epitaxial layer) formed on the substrate 1 (on the surface of the substrate 1). The SiC layer 2 is formed on a substrate by an epitaxial growth method of growing on the crystal substrate a single crystal having a crystal orientation identical to that of the substrate crystal. However, in other embodiments, the SiC layer 2 may not necessarily have a crystal orientation identical to that of the substrate crystal depending on the characteristics of the semiconductor device 10 which is manufactured by a film deposition apparatus 100, or may be polycrystalline.

P-type impurity diffusion regions 3A and 3B are formed on the SiC layer 2 to be spaced from each other at a predetermined distance, and n-type impurity diffusion regions 4A and 4B are formed in the p-type impurity diffusion regions 3A and 3B, respectively. Further, a gate insulating film 6 is formed on the SiC layer 2 such that it extends from a part of the n-type impurity diffusion region 4A to a part of the p-type impurity diffusion region 4B, and an electrode 7 is formed on the gate insulating film 6.

Moreover, an electrode 5A is formed on the p-type impurity diffusion layer 3A and the n-type impurity diffusion region 4A, and an electrode 5B is formed on the p-type impurity diffusion layer 3B and the n-type impurity diffusion region 4B. Furthermore, an electrode 8 is formed on a surface (backside) of the substrate 1 opposite to the SiC layer 2.

In the above semiconductor device (MOS transistor), for example, the electrode 7 serves as a gate electrode; the electrodes 5A and 5B serve as source electrodes; and the electrode 8 serves as a drain electrode.

The above semiconductor device 10 is advantageous in that a so-called on-resistance (resistance of a drift layer) can be drastically reduced in comparison with a conventional semiconductor device using, e.g., Si, thereby resulting in an improvement in the electric power utilization efficiency.

FIG. 2 compares characteristics of Si, GaAs and Sic used as semiconductor materials.

Referring to FIG. 2, it is seen that SiC has a dielectric breakdown electric field strength Ec about ten times higher than that of Si generally and conventionally used for manufacturing a semiconductor device. The on-resistance is inversely proportional to the cube of the dielectric breakdown electric field strength. Hence, in a semiconductor device using SiC having a large dielectric breakdown electric field strength Ec, the electric power utilization efficiency can be improved by reducing the on-resistance.

Further, SiC has a wide band gap compared to Si and GaAs, so that a semiconductor device using SiC can operate at a high temperature. For example, a semiconductor device made of Si can operate at a temperature ranging up to about 150° C., whereas a semiconductor made of SiC can operate at a temperature higher than or equal to 400° C.

Therefore, a semiconductor device using SiC does not require a cooling unit which is necessary for a conventional semiconductor device and, also, can be used under more severe conditions than the conventional ones.

In addition, in a so-called power device handling at a high current, the use of SiC having a low resistance value makes it possible to reduce a device area, thereby enabling to realize scaling down of an equipment by using the corresponding device.

SiC can be formed by, e.g., an epitaxial growth method that using gas decomposition by induction heating. In this case, a gaseous mixture of $SiH_4$ and $H_2$ for example can be used for SiC film deposition. Moreover, it is possible to use a hydrocarbon-based gas (gas represented by $C_xH_y$ (x and y being integers) such as $C_3H_8$ or the like which is not easily decomposed in addition thereto. For example, when $C_3H_8$ is used, the substrate needs to be heated to a temperature higher than or equal to 1200° C., causing the following problems.

For example, when the substrate is inductively heated, the substrate supporting unit supporting the substrate is heated together with the substrate and the substrate is also heated by radiant heat from the substrate supporting unit. However, it is generally difficult to uniformly heat the substrate supporting unit up to a temperature higher than or equal to 1200° C. at which a film deposition gas (hydrocarbon-based gas) is decomposed. For example, the temperature of the substrate may decrease at the upstream side and increase at the downstream side of the flow of the film deposition gas flowing in the processing chamber. Further, the temperature difference may occur between the central portion and the peripheral portion of the substrate supporting unit supporting the substrate.

For that reason, in the film deposition apparatus in accordance with the embodiment of the present invention, a coil for inductively heating the substrate supporting unit is divided into a plurality of regions, and a control unit for controlling the coil region by region is provided.

By dividing the coil into a plurality of regions and controlling the coil region by region as described above, the uniform distribution of the temperature of the substrate supporting unit with induction heating can be easily improved, and the temperature uniformity of the substrate supported by the substrate supporting unit increases. As a result, the film deposition can be stably performed while ensuring good the intra- and the inter-substrate uniformity in film thickness or film quality.

Hereinafter, an example of a configuration of the above film deposition apparatus and an example of a film deposition method using the film deposition apparatus will be described with reference to FIG. 3.

First Embodiment

Figure 3:
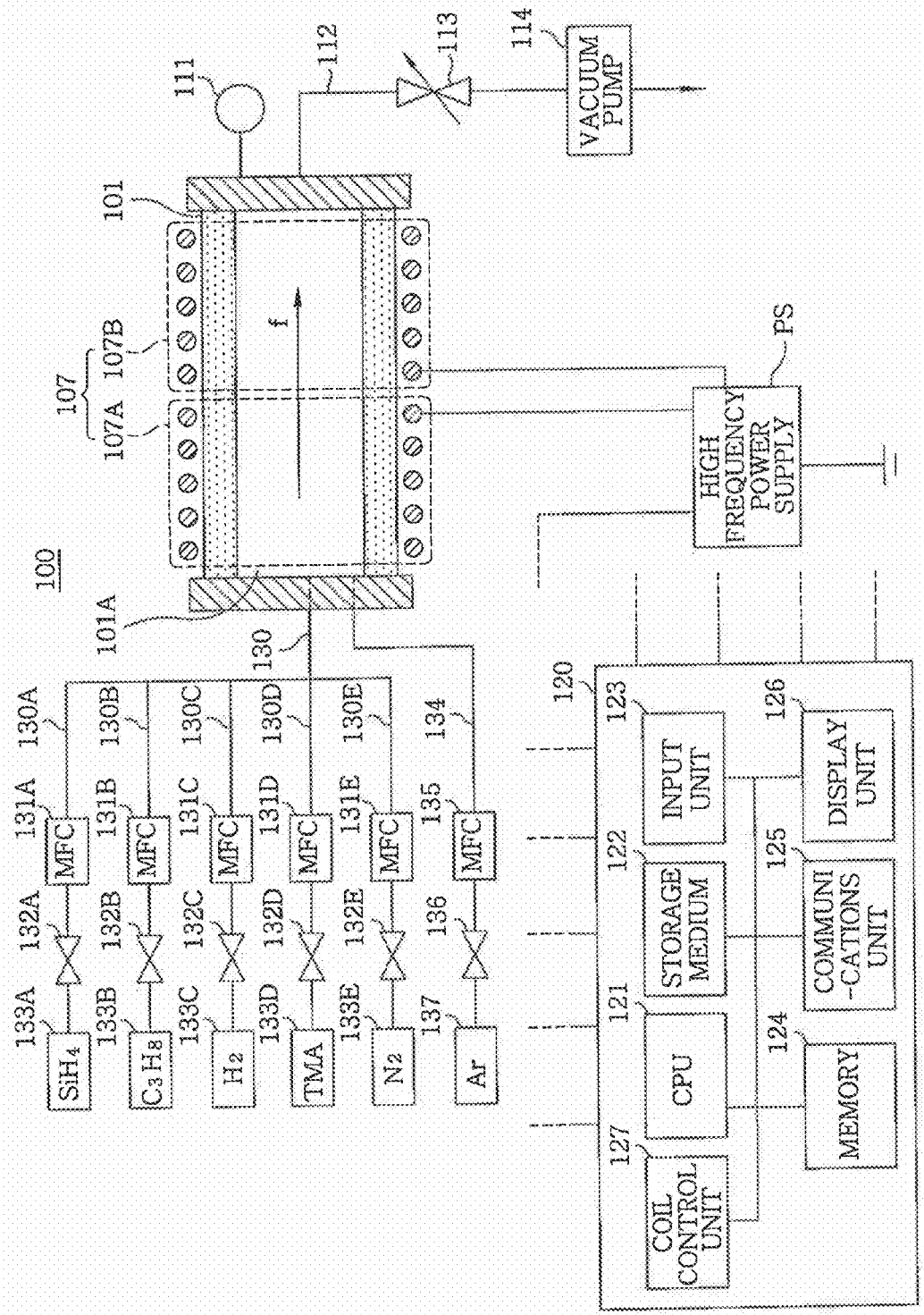
FIG. 3 schematically illustrates an outline of a film deposition apparatus in accordance with an embodiment of the present invention.

FIG. 3 schematically illustrates a film deposition apparatus 100 in accordance with a first embodiment of the present invention. Referring to FIG. 3, the film deposition apparatus 100 has a substantially cuboid-shaped (substantially housing-shaped) processing chamber 101 inside which a vacuum space 101A is defined.

Figure 4:
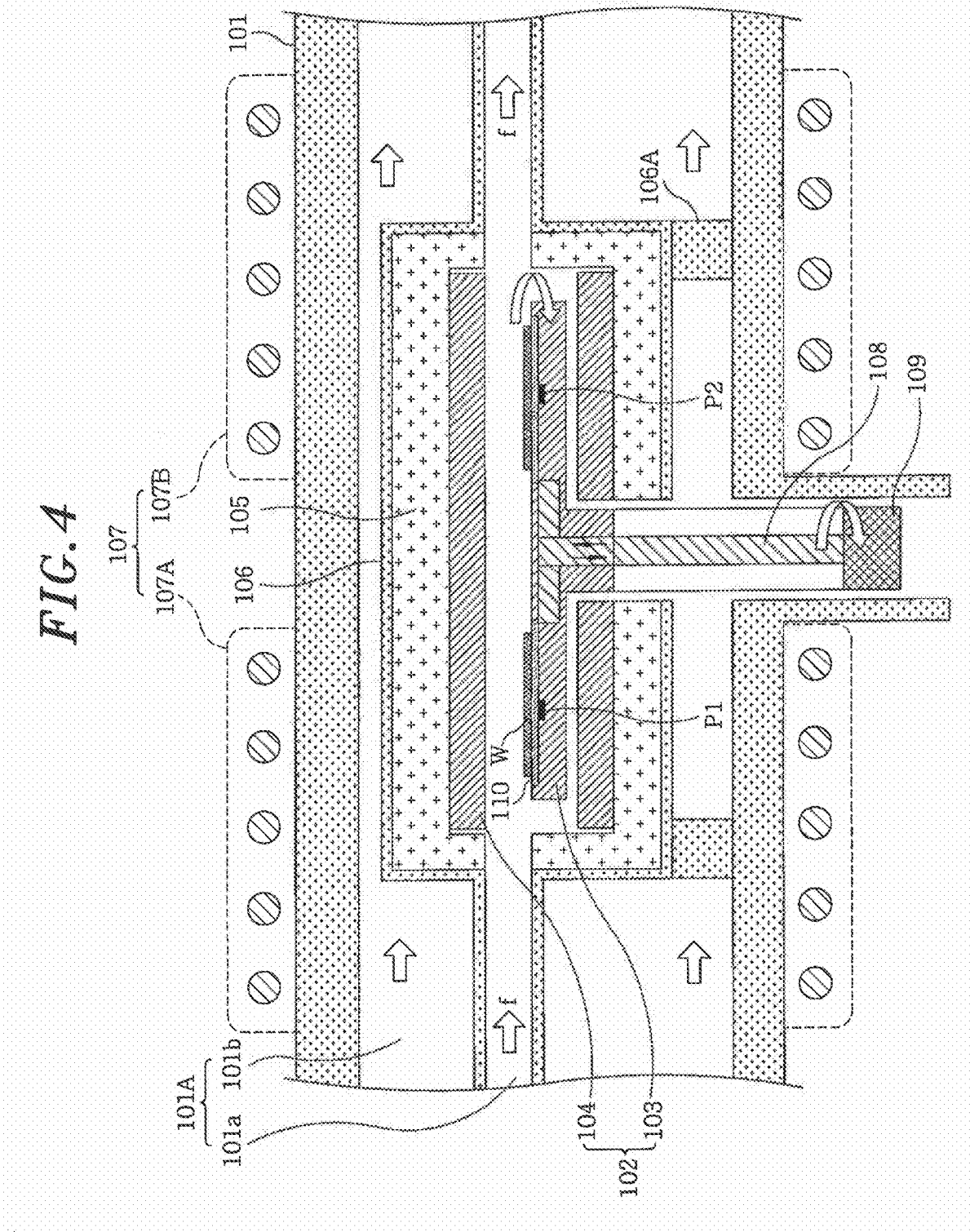
FIG. 4 provides a cross sectional view schematically showing an inner structure of a processing chamber of the film deposition apparatus shown in FIG. 3.

Provided in the vacuum space 101A is a substrate supporting unit for supporting a substrate (the substrate and the substrate supporting unit not being shown in FIG. 3, but illustrated in detail in FIG. 4). A semiconductor film epitaxially grows on the substrate supported by the substrate supporting unit. Further, an inner structure of the vacuum space 101A is not shown in FIG. 3, but is illustrated in detail in FIG. 4 and the drawings thereafter.

Besides, the processing chamber 101 is connected with a gas exhaust unit 114, e.g., a vacuum pump or the like, and a gas exhaust line 112 provided therein a pressure control unit 113 having, e.g., a conductance variable valve, so that a pressure inside the vacuum space 101A can be adjusted (depressurized) to a pressure lower than the atmospheric pressure. Moreover, the processing chamber 101 is provided with a pressure gauge 111. The pressure inside the vacuum space 101A is controlled by the pressure control unit 113 based on the pressure value measured by the pressure gauge 111.

Also, a film deposition gas as a film deposition source material is supplied into the processing chamber 101 (the vacuum space 101A) through a gas line 130. Further, the gas line 130 is connected with gas lines 130A, 130B, 130C, 130D and 130E.

The gas line 130A having a mass flow controller (MFC) 131A and a valve 132A is connected with a gas supply source 133A for supplying $SiH_4$ gas, and $SiH_4$ gas 4 is supplied into the processing chamber 101.

In the same manner, the gas lines 130B to 130E having mass flow controllers (MFC) 131B to 131E and valves 132B to 132E are connected with gas supply sources 133B to 133E, respectively. $C_3H_8$ gas, $H_2$ gas, TMA (Trimethylaluminum) gas and $N_2$ gas are supplied from the gas supply sources 133B to 133E, respectively.

For example, when an SiC film epitaxially grows on a substrate in the processing chamber 101, it is preferable to supply $SiH_4$ gas, $C_3H_8$ gas and $H_2$ gas as film deposition source gas into the processing chamber 101.

A coil 107 is installed outside the processing chamber 101 in order to inductively heat the substrate and the substrate supporting unit (to be described later with reference to FIG. 4). The coil 107 is wound around the processing chamber 101 to surround the processing chamber 101. The substrate supporting unit or the substrate in the vacuum space 101A is inductively heated by applying a high frequency power from a high frequency power supply PS. As a result, a film mainly made of Si and C (SiC film) can be epitaxially grown on the substrate.

Further, if necessary, TMA gas and/or $N_2$ gas may be supplied, in addition to $SiH_4$ gas, $C_3H_8$ gas and $H_2$ gas, into the processing chamber 101, thereby controlling the electrical characteristics of the SiC film that is being formed. The above gases are examples of gases used for film formation. However, in the present invention is not limited thereto. An SiC film may be formed by using gases other than the above gases. Besides, instead of an SiC film, other films may be formed by using other gases.

Besides, a cooling gas for cooling the processing chamber 101 is supplied to the processing chamber 101 (the vacuum space 101A) through a gas line 134. The gas line 134 having the MFC 135 and the valve 136 is connected with a gas supply source 137 for supplying a cooling gas (e.g., inert gas such as Ar or the like), so that the cooling gas can be supplied into the processing chamber 101. Specific supply channels of the film deposition gas and the cooling gas in the processing chamber 101 will be described later with reference to FIG. 4.

Further, a film deposition procedure (e.g., operations including opening and closing of valves, flow rate control, high frequency power application and the like) in the film deposition apparatus 100 is performed based on a program referred to as, e.g., a recipe. In this case, the operations of the valve, the MFC and the like are controlled by a controller 120 having a CPU 121. A connecting wiring thereof is not illustrated.

The controller 120 includes a CPU 121, a storage medium 122 which stores therein the program, an input unit 123 such as a keyboard or the like, a display unit 126, a communications unit 125 for connection with a network or the like, a memory 124 and a coil control unit 127 for controlling the coil 107.

In the film deposition apparatus 100 in accordance with the present embodiment, the coil 107 is divided into a plurality of regions (coils). For example, the coil 107 includes two coils (regions) 107A and 107B. Further, the coil 107 is controlled by the coil control unit 127 region by region (the coils 107A and 107B). To be specific the high frequency power supply PS is connected with the coil control unit 127 (the controller 120), and the coil 107 is divided into regions (the coils 107A and 107B) such that each of the regions is controlled separately by the coil control unit 127.

With the above configuration, it is possible to improve the temperature uniformity of the substrate even when the substrate is heated to a high temperature higher than or equal to about 1200° C. at which a film deposition gas (hydrocarbon-based gas, e.g., $C_3H_8$ gas or the like) is decomposed.

For example, a film deposition gas flow f is formed inside the processing chamber 101 in a direction from the gas line 130 for supplying the film deposition gas toward the gas exhaust line 112 for exhausting the film deposition gas. In that case, if a uniform high frequency power is applied to the entire coil 107, the temperature of the substrate (the substrate supporting unit) may decrease at the upstream side and increase at the downstream side of the film deposition gas flow f.

In the present embodiment, by separately controlling the coils 107A and 107B (the applied high frequency powers to the coils 107A and 107B), the substrate can be uniformly heated while suppressing the non-uniform temperature distribution caused by, e.g., the film deposition gas flow.

Hereinafter, a structure of the processing chamber 101 will be explained with reference to FIG. 4. FIG. 4 is a cross sectional view schematically showing an inner structure of the processing chamber 101 described in FIG. 3.

Here, like reference numerals are used for like parts describe above. Referring to FIG. 4, a substrate supporting unit 102 for supporting substrates W in the vacuum space 101A is provided inside the processing chamber 101.

The substrate supporting unit 102 is inductively heated by the coil 107 provided outside the processing chamber 101. The substrates W are inductively heated by the coil 107 and also by radiant heat or thermal conductivity from the inductively heated substrate supporting unit 102. The substrates W are heated to a temperature at which surface reaction (epitaxial growth) caused by decomposition of a supplied film deposition gas can occur.

For example, the aforementioned $C_3H_8$ gas starts to be decomposed at about 1200° C., so that the substrates W need to be heated to a temperature higher than or equal to at least 1200° C. (e.g., about 1550° C. to 1650° C.). In this case, the substrate supporting unit 102 is also heated to substantially the same temperature.

Further, a heat insulating member 105 for thermally insulating the processing chamber 101 from the substrate supporting unit 102 (the substrates W) that is inductively heated to a high temperature is installed between the substrate supporting unit 102 (the substrates W) and the processing chamber 101.

Accordingly, even when the substrate supporting unit 102 (the substrates W) is kept at the high temperature, a large temperature difference between the heated portions and the processing chamber 101 can be maintained. As a result, it is possible to suppress the damage of the processing chamber 101 or the generation of released gas.

Moreover, the heat insulation property between the processing chamber 101 and the portions heated to a high temperature in the processing chamber 101 is superior, so that a degree of freedom in selecting a material forming the processing chamber 101 increases. The processing chamber 101 is made of, e.g., quartz. Quartz has a low dielectric loss and is suitable for induction heating. Further, Quartz has high purity and generates, even when heating is performed in a vacuum state, a small amount of released gas that may contaminate a film and thus is preferably used as a material for defining a vacuum space in the case of depositing a film for a high performance device.

Further, the substrate supporting unit 102 heated to a high temperature and the heat insulating member 105 in the vacuum space 101A are preferably made of a stable and clean (high purity) material that is hardly decomposed or deteriorated by heating and hardly generates contaminants during heating. For example, the substrate supporting unit 102 and the heat insulating member 105 are preferably made of carbon (graphite).

Furthermore, the substrate supporting unit 102 is preferably made of a high-density carbon material so that it can be easily inductively heated, and also, the substrate can be heated by radiant heat from the substrate supporting unit 102. As for the carbon material, it is preferable to use one having a high density as to be referred to as, e.g., a so-called bulk material.

Meanwhile, the heat insulating member 105 is preferably made of a carbon material having a low density in order to increase its insulating property. It is preferable that such carbon material has a considerably higher porosity than that of the bulk material. To be specific, it is more preferable that the pores of the carbon material suitable for heat insulation can be seen with, e.g., naked eyes. In this specification, such materials may be referred to as porous materials regardless of the shape of the pores.

In addition, if necessary, the heat insulating member 105 may be made of a carbon material which contains a material for controlling thermal conductivity of carbon so long as the amount of the material is small enough so that it does not contaminate the film formed on a substrate.

In other words, the substrate supporting unit 102 and the heat insulating member 105 are mainly made of the same material (carbon) suitable for heating in a vacuum state. However, these carbons differ from each other in thermal conductivity due to a density difference (microstructure of a material).

Further, a predetermined coating film may be formed on the surface of the heat insulating member 105 or the substrate supporting unit 102. In the present embodiment, for example, the surface of the substrate supporting unit 102 is coated with an SiC film, and the surface of the heat insulating member 105 is coated with a carbon film having a higher density than that of the heat insulating member 105. The presence of the coating films makes it possible to preserve the materials and suppress the generation of particles or the reaction between gases and the surface of the insulating member.

Furthermore, a heat insulating member supporting structure 106 made of quartz is formed outside the heat insulating member 105 so as to cover the heat insulating member 105. The heat insulating member 105 is separated from the processing chamber 101 at a distance therebetween by the heat insulating member supporting structure 106. Accordingly, a heat insulating space 101b is defined between the processing chamber 101 and the heat insulating member 105, and the temperature increase of the processing chamber 101 is effectively suppressed. The heat insulating member supporting structure 106 is mounted on a bottom surface of the processing chamber 101, and is supported by a columnar support 106A.

Further, a cooling gas (e.g., Ar gas or the like) is supplied through the gas line 134 (FIG. 3) to the heat insulating space 101b. The temperature increase in the processing chamber 101 is suppressed by the cooling action of the cooling gas.

Moreover, a film deposition gas is supplied from the gas line 130 (Shown in FIG. 3) into a film deposition gas supply space 101a where the heat insulating member 105 and the substrate supporting unit 102 defined inside the heat insulating member supporting structure 106 are installed. That is, due to the presence of the heat insulating member supporting structure 106, the film deposition gas is effectively supplied to the substrates W without being diffused in the vacuum space 101A. This configuration contributes to improvement in the utilization efficiency of the film deposition gas.

In other words, the vacuum space 101A is divided by the heat insulating member supporting structure 106 substantially into two spaces (the film deposition gas supply space 101a and the heat insulating space 101b). Accordingly, it is possible to effectively suppress the temperature increase in the processing chamber 101 and improve the utilization efficiency of the film deposition gas. In this case, the film deposition gas flow f is formed in substantially parallel with the substrates W in a direction from a film deposition gas supply port (connection part between the processing chamber 101 and the gas line 130 (Shown in FIG. 3) toward a film deposition gas exhaust port (connection part between the processing chamber 101 and the gas exhaust line 112 (Shown in FIG. 3)).

Moreover, the substrate supporting unit 102 includes a mounting table 103 for mounting thereon the substrates W and a heating structure 104 formed around the mounting table 103.

Further, the mounting table 103 is formed in a substantially disc shape, and has a recess on a surface thereof. A substantially disc-shaped transfer plate 110 is mounted in the recess, and a plurality of substrates W is mounted on the transfer plate 110. The transfer plate 110 on which the substrates W are mounted is transferred by a transfer unit (to be described later) such as a transfer arm or the like, and is mounted in the recess of the mounting table 103.

Besides, the mounting table 103 is configured so that a shaft 108 is inserted into a central opening formed at a central portion of the mounting table 103. The shaft 108 can rotate and move up and down by a movable unit 109. A substantially disc-shaped leading end portion is formed at an upper end of the shaft 108 to render the stepped shape. The leading end portion is fitted into the central opening formed at the center of the transfer plate 110 such that the transfer plate 110 can be lifted. The transfer plate 110 is lifted by the shaft 108 when the transfer plate 110 is transferred.

During the film deposition, the mounting table 103 and the transfer plate 110 rotate about the shaft 108. Accordingly, the intra- and the inter-substrate W variations in film deposition (a film deposition rate, a film thickness, a film quality and the like) can be reduced.

Figure 5:
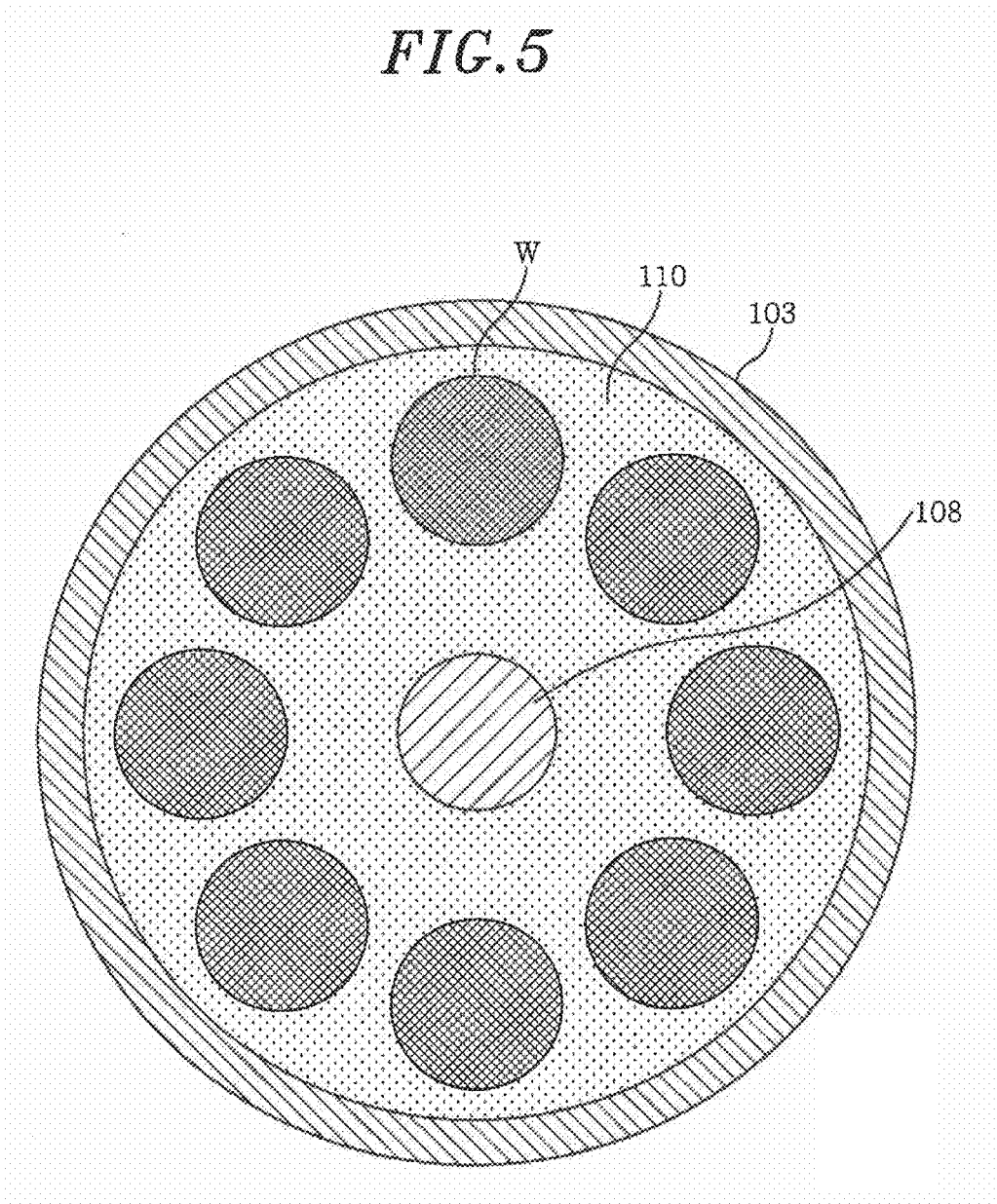
FIG. 5 presents a schematic view showing a substrate supporting unit installed inside the processing chamber shown in FIG. 4.

FIG. 5 is a top view showing the transfer plate 110 mounted on the mounting table 103 and a plurality of the substrates W mounted on the transfer plate 110. Further, the leading end portion of the shaft 108 is insertion into the central opening of the transfer plate 110 to be fitted thereto. Although this drawing illustrates, as an example, eight substrates W mounted to be equally spaced at predetermined angles, the mounting position and the number of mounted substrates are not limited thereto. Further, the transfer plate 110 is inductively heated inside the vacuum space 110A, and thus is preferably made of a material (carbon) same as that of the mounting table 103.

Figure 6:
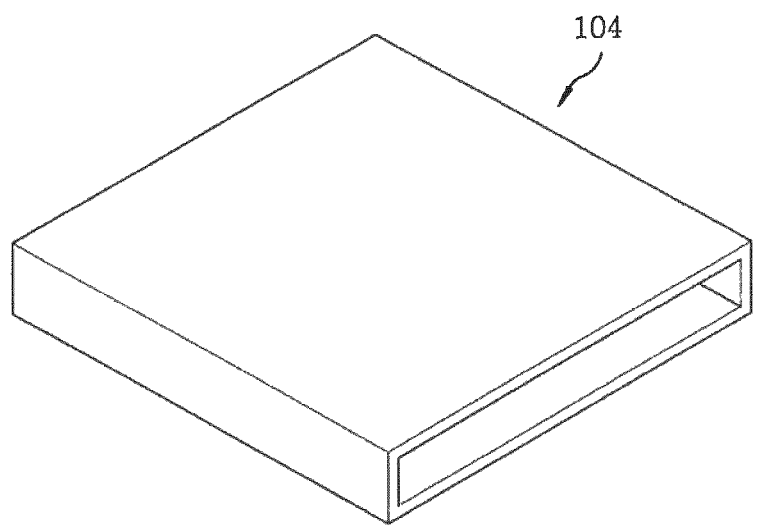
FIG. 6 represents another schematic view illustrating the substrate supporting unit installed inside the processing chamber shown in FIG. 4.

FIG. 6 is a perspective view of the heating structure 104 forming the substrate supporting unit 102 together with the mounting table 103. Referring to FIG. 6, the heating structure 104 is formed in, e.g., a substantially housing shape (cuboid shape) and is disposed around the mounting table 103 so as to surround the mounting table 103.

Further, the cuboid body has openings formed on two opposite faces thereof, so that a film deposition gas is supplied from one of the openings and exhausted through the other opening. With this structure, the film deposition gas supplied to the film deposition gas supply space 101a (Shown in FIG. 4) flows in a direction substantially parallel to the substrate W, and then is exhausted from the processing chamber 101.

In the film deposition apparatus 100 of the present embodiment, the substrate W can be more efficiently and uniformly heated by installing in the processing chamber 101 the heating structure 104 and the mounting table 103 to be inductively heated. For example, the substrates W can be heated by induction heating and by radiant heat from the mounting table 103 (the transfer plate 110). Further, the substrates W can be heated more efficiently with the presence of the heating structure 104 having a comparatively larger volume. Moreover, by radiant heat from the heating structure 104, the substrates W are heated from its surroundings (in a plurality of directions), thereby heating the substrates W more uniformly.

In the film deposition apparatus 100 of the present embodiment, the coil 107 for induction heating includes a plurality of divided coils 107A and 107B as described above. In this case, the coil 107A is disposed at the upstream side of the film deposition gas flow f, and the coil 107B is disposed at the downstream side of the film deposition gas flow f.

For example, a low-temperature gas containing a large amount of an undecomposed film deposition gas is introduced at the upstream side of the film deposition gas flow, so that the temperature of the substrate W may be easily decreased. However, when an input power supplied to the coil 107A is set to be higher than that supplied to the coil 107B, the temperature of the substrates W can be maintained at a predetermined film deposition temperature.

On the other hand, the gas being heated at the upstream side flows at the downstream side of the film deposition gas flow, so that the temperature of the substrates W is hardly decreased.

Therefore, even if the power supplied to the coil 107B is lower than that supplied to the coil 107A, the temperature of the substrates W at the downstream side can be maintained at a predetermined film deposition temperature as in the upstream side.

By dividing the coil 107 into a plurality of regions to be disposed along the film deposition gas flow and controlling each of the divided regions separately, the intra- and the inter-substrate W temperature uniformity can be improved. As a result, a film with less variation in quality can be obtained.

Moreover, if the above-described temperature control is carried out based on the temperature of the substrate supporting unit 102 (the mounting table 103) which is detected by temperature detectors P1 and P2 installed at the substrate supporting unit 102 (the mounting table 103), the substrate temperature can be more precisely controlled, which is preferable. For example, the substrate supporting unit 102 may be provided with a single temperature detector or a plurality of temperature detectors (e.g., two temperature detectors P1 and P2), as can be seen from FIG. 4.

Further, when the coils 107A and 107B are separately controlled, the level of the high frequency power, the timing of applying the high frequency power, the frequency of the high frequency power and the like may vary between the coils 107A and 107B.

Figure 7:
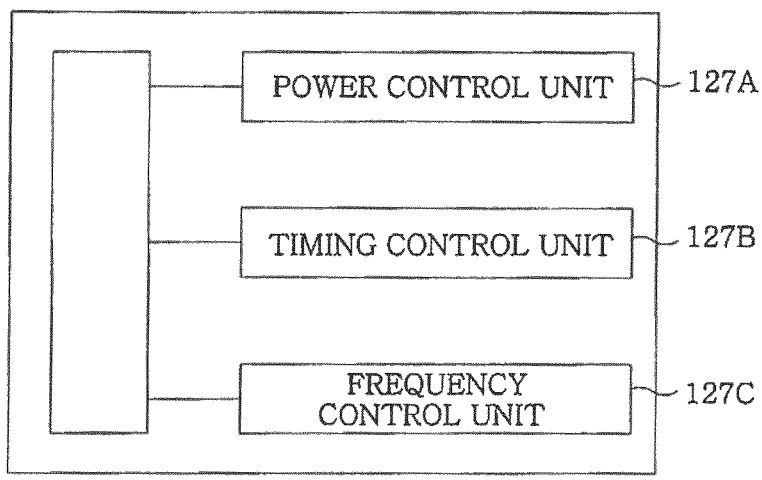
FIG. 7 schematically depicts a coil control unit used in the film deposition apparatus shown in FIG. 3.

FIG. 7 schematically shows an example of the coil control unit 127 (Shown in FIG. 3) for controlling the coil 107 (the coils 107A and 107B). Moreover, the above configuration of the coil control unit 127 is an example, so that the coil control unit does not necessarily require all the following configurations.

Referring to FIG. 7, the coil control unit 127 includes, e.g., a power control unit 127A, a timing control unit 127B and a frequency control unit 127C.

The power control unit 127A controls a high frequency power applied to the coils 107A and 107B. In other words, the high frequency power applied to the coils 107A and 107B is separately controlled (to be different between the coils 107A and 107B) by the power control unit 127A.

Further, the timing control unit 127B control timing of applying the high frequency power to the coils 107A and 107B. That is, the timing of applying the high frequency power to the coils 107A and 107B is separately controlled (to be different between the coils 107A and 107B) by the timing control unit 127B.

Furthermore, the high frequency control unit 127C controls the frequency of the high frequency power applied to the coils 107A and 107B. In other words, the frequency of the high frequency power applied to the coils 107A and 107b is separately controlled (to be different between the coils 107A and 107B) by the frequency control unit 127C. Besides, the frequency control unit 127C may be incorporated in the high frequency power supply PS.

Moreover, in order to carry out the control described above, a single high frequency power supply PS may be used such that the high frequency power is distributed to a plurality of coils (regions), or the same number of high frequency power supplies may be prepared according to the plurality of the coils (regions).

Further, in the case where the high frequency power is separately applied to a plurality of coils (regions), the high frequency interference between the coils (regions) can be reduced, which is preferable, if the coils are controlled as will be described later. Also, when the high frequency interference between the coils is reduced, the substrate temperature can be controlled more precisely, resulting in a further improvement in the uniformity of heating the substrate.

For example, the high frequency interference between the coils can be reduced by varying the timing of applying the high frequency power to the coils 107A and 107B by the timing control unit 127B. For example, at first, a high frequency power applied to the coil 107A is ON. Next, the high frequency power applied to the coil 107A is OFF after a predetermined period of time and, then, a high frequency power applied to the coil 107B is ON. By varying the timing of applying the high frequency power to the coils as described above, the high frequency interference can be reduced.

Further, the high frequency interference can be reduced by varying the frequency of the high frequency power applied to the coils. For example, the frequency control unit 127C is used to apply different frequency of the high frequency power to each of the coils 107A and 107B, so that the interference between the coils 107A and 107B can be reduced. Further, as described above, the frequency control unit 127C can be incorporated in the high frequency power supply PS. Furthermore, a plurality of high frequency power supplies of different frequencies may be controlled by the frequency control unit 127C to make the different frequencies of the high frequency powers can be applied to the coils 107A and 107B.

In addition, when the timing control unit 127B and the frequency control unit 127C are used together, the high frequency interference between the coils can be more preferably reduced.

That is, when the timing control unit 127B and the frequency control unit 127C are used together, the substrate W can be uniformly heated and, also, the high frequency interference can be preferably reduced.

Hereinafter, an example of a film deposition method using the film deposition apparatus 100 will be described with reference to the flow chart shown in FIG. 8.

First, in a step S1, a film deposition gas is supplied toward the substrates W supported by the substrate supporting unit 102 installed in the vacuum space 101A of the processing chamber 101. As described with reference to, e.g. FIG. 3, $SiH_4$ gas, $C_3H_8$ gas and $H_2$ gas are supplied, as film deposition gas, into the processing chamber 101 (film deposition gas supply space 101a). Further, if necessary, TMA gas and/or $N_2$ gas may also be supplied.

For example, e.g., $SiH_4$ gas, $C_3H_8$ gas and $H_2$ gas serving as the film deposition gas have the flow rates of 10 sccm (standard cubic centimeters per minute) to 30 sccm, 10 sccm to 20 sccm and 50 slm (standard liters per minute) to 200 slm, respectively. However, the values are not limited thereto.

Next, in step S2, the coils 107A and 107B installed outside the processing chamber 101 are separately controlled, and the substrate supporting unit 102 (and the substrates W) is inductively heated. Accordingly, the temperature of the substrates W is maintained at a temperature ranging from about 1550° C. to 1650° C.

In this case, as set forth above, the level of the high frequency power applied to the coils 107A and 107B can be separately controlled (to be different between the coils 107A and 107B) by the power control unit 127A.

Moreover, for example, the timing control unit 127B controls timing of applying the high frequency power to the coils 107A and 107B. That is, the timing of applying the high frequency power to the coils 107A and 107B is separately controlled (to be different between the coils 107A and 107B) by the timing control unit 127B.

Furthermore, the frequency of the high frequency power applied to the coils 107A and 107B can be separately controlled (to be different between the coils 107A and 107B) by the high frequency control unit 127C.

As a result, a film mainly made of Si and C (SiC film) can be uniformly formed on the substrate W by an epitaxial growth method.

Either step 1 or step 2 may be performed first, or steps 1 and 2 may be performed simultaneously. Further, a period of time for each step may be properly adjusted to allow the SiC film to form with a predetermined film thickness.

Further, the method of installing the coil and the method of dividing the coil region can be variously modified and changed without being limited to the above-described example.

Figure 9:
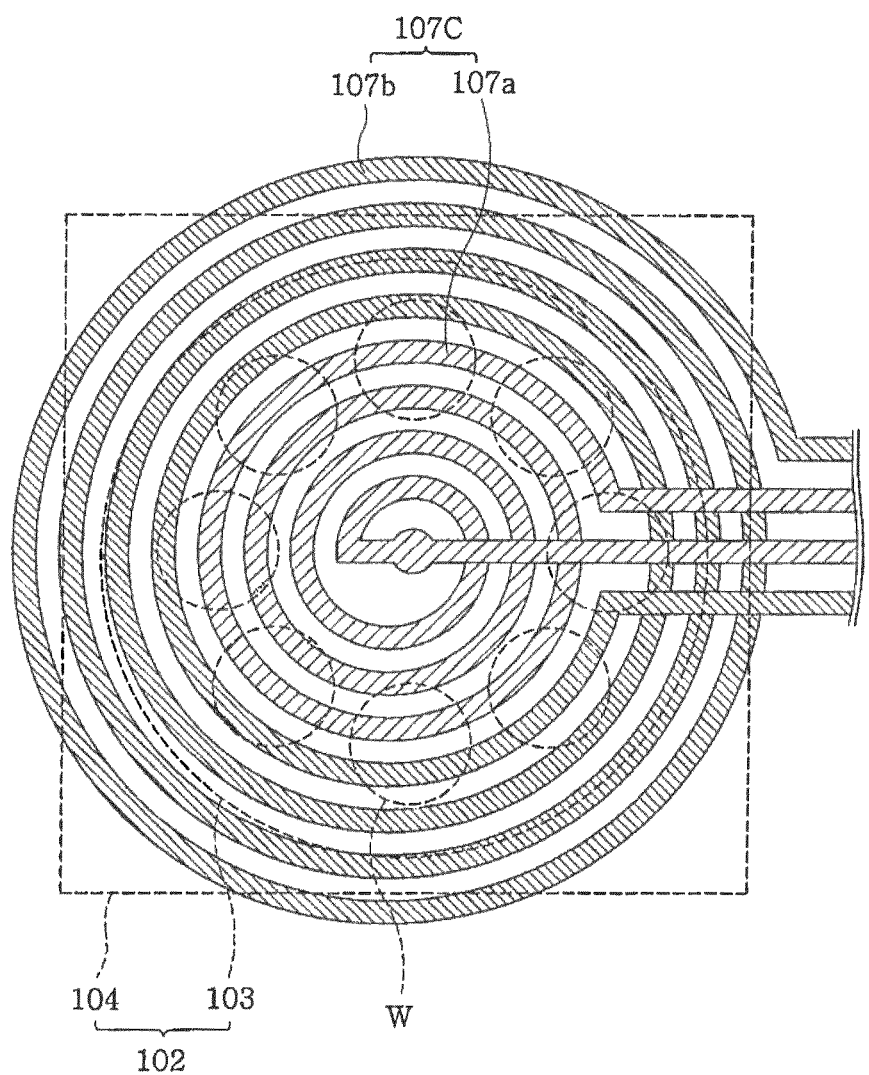
FIG. 9 shows a modification of a coil used in the film deposition apparatus shown in FIG. 3.

FIG. 9 is a top view showing a coil 107C as a modification of the coil 107. The coil 107 may be provided outside the processing chamber 101 (Shown in FIG. 4) so as to face the substrate W (the mounting table 103). FIG. 9 shows a positional relationship between the substrates W/the substrate supporting unit 102 (the mounting table 103 and the heating structure 104) with respect to the coil 107C.

Referring to FIG. 9, the coil 107C includes two spiral-type coils 107a and 107b. In other words, the coil 107C is divided into the coils 107a and 107b. The coil 107a is installed inside the coil 107b. Further, the centers of the coils 107a and 107b correspond to the center of the mounting table 103. With this configuration, the coil 107C generally has an overall shape whose center corresponds to a center of a circle formed by connecting the centers of the substrates W mounted on the mounting table 103.

The coil 107C can provide the same effect as that of the coil 107 by performing the same control as that described in the coil 107. In other words, the coils 107a and 107b of the coil 107C correspond to the coils 107A and 107B of the coil 107.

In the case of the coil 107C as well, the separate control of the coils 107a and 107b makes it possible to improve the intra- and the inter substrates W temperature uniformity and form a film with less variation in quality.

The coil 107 or 107C is not necessarily divided into two coils, and may be divided into, e.g., three or four coils, or into a plurality of coils.

Hereinafter, an example of a film deposition equipment in which the processing chamber 101 is connected with a transfer chamber will be explained. For example, when a semiconductor device is formed on a substrate, a transfer chamber for transferring a substrate (a transfer plate on which the substrate is mounted) is generally used. Accordingly, the film deposition equipment has a structure having a transfer chamber, as will be described hereinafter.

Figure 10:
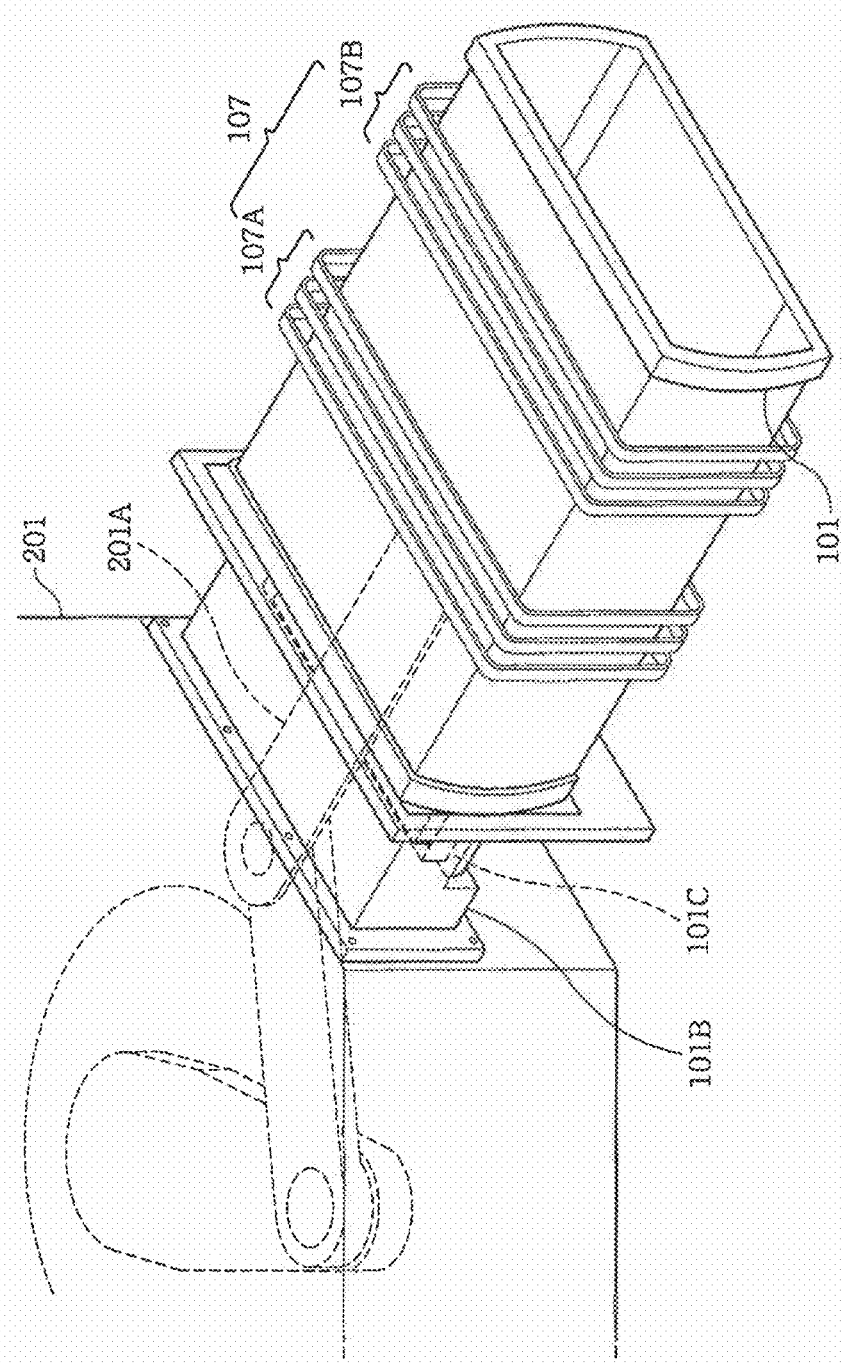
FIG. 10 depicts an example in which a transfer chamber is connected with a processing chamber.

FIG. 10 is a perspective view schematically showing an example of a film deposition equipment in which a processing chamber 101 is connected with a transfer chamber 201 having a transfer arm (transfer unit) 201A. Here, like reference numerals are used for like parts described above, and redundant description thereof will be omitted. Further, the illustration of a gas exhaust line connected with the processing chamber 101 and the like is omitted.

Referring to FIG. 10, the processing chamber 101 described with reference to FIG. 4 is connected with a transfer chamber 201 having therein a transfer arm through a processing tube 101B. Further, a gas nozzle (film deposition gas supply unit) 101C for supplying a film deposition gas is installed below the processing tube 101B. The film deposition gas is supplied through the gas nozzle 101C into the film deposition gas supply space 101a (shown in FIG. 4). Further, the number of turns of the coil 107 (coils 107A and 107B) can be varied.

In the above-described structure, the transfer plate 110 having thereon the substrates W shown in FIG. 5 is loaded from the transfer chamber 201 into the processing chamber 101. In other words, the transfer plate 110 is loaded into the film deposition gas supply space 101a (shown in FIG. 4) through an opening (not shown in this drawing) of the heating structure 104 by the transfer arm 201A, and then is mounted on the mounting table 103. After the film deposition on the substrate W is completed, the transfer plate 110 is unloaded from the processing chamber 110 into the transfer chamber 201 by the transfer arm 201A.

Figure 11:
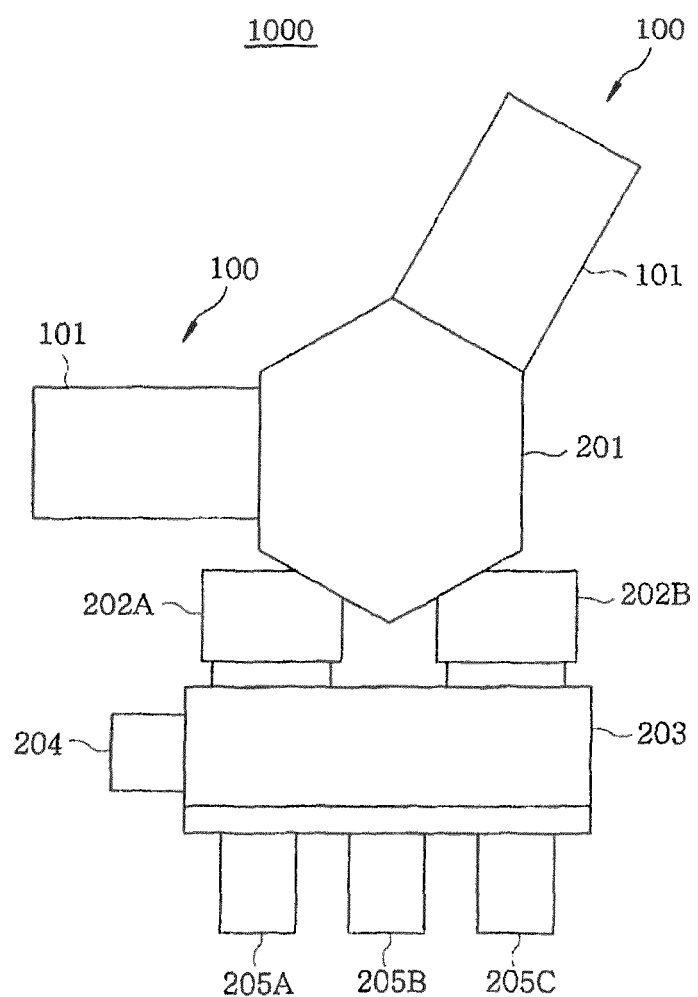
FIG. 11 offers an example in which a transfer chamber is connected with a plurality of processing chambers.

FIG. 11 is a top view schematically showing an example of the film deposition equipment 1000 in which the transfer chamber 201 is connected with a plurality of processing chambers 101 (film deposition apparatuses 100). Here, like reference numerals are used for like parts described above, and redundant description thereof will be omitted.

Referring to FIG. 11, the film deposition equipment 1000 has ports 205A to 205C for mounting thereon a holder (not shown) on which the transfer plate 110 is mounted and a loader 203 serving as a transfer area of the corresponding holder.

Figure 8:
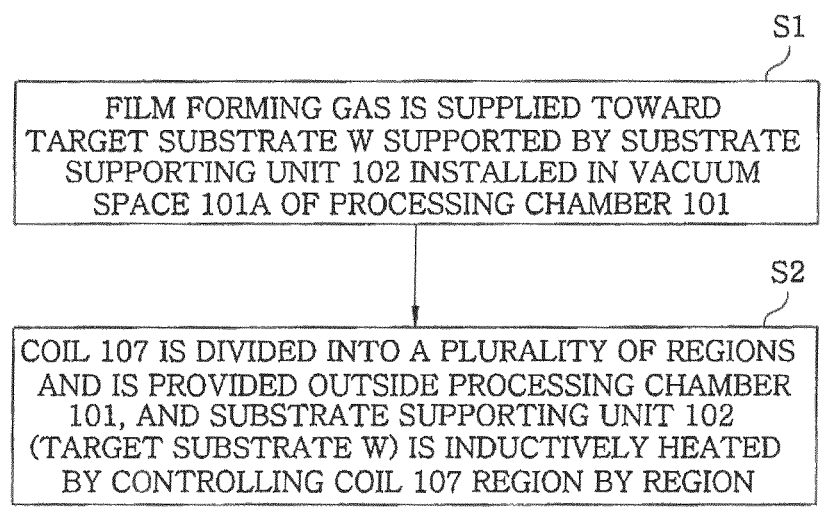
FIG. 8 provides a flow chart illustrating a film deposition method in accordance with an embodiment of the present invention.

Further, the loader 203 is connected with load-lock chambers 202A and 202B into which the transfer plate 110 is loaded, and the load-lock chambers 202A and 202B are connected with the transfer chamber 201 described in FIG. 8.

The transfer chamber 201 is connected with two processing chambers 101. Further, the illustration of other structures (a coil, a high frequency power supply, a gas exhaust line, a gas line and the like) except the processing chamber 101 of the film deposition apparatus 100 is omitted.

The transfer plate 110 (the substrates W) mounted on any one of the ports 205A to 205C is loaded into either one of the load-lock chambers 202A and 202B via the loader 203. Then, the transfer plate 110 is transferred from either one of the load-lock chambers 202A and 202B to the film deposition apparatus 100 (processing chamber 101) via the transfer chamber 201. Further, if necessary, the position alignment of the transfer plate 110 can be performed by using a position alignment mechanism 204 installed at the loader 203.

After the film deposition is completed by the film deposition apparatus 100, the transfer plate 110 (the substrates W) is transferred to either one of the load-lock chamber 202A or 202B via the transfer chamber 201, and then is returned to any one of the ports 205A to 205C via the loader 203.

By connecting the transfer structure such as the the transfer chamber 201 for transferring, e.g., the transfer plate (the substrates) or the like with the film deposition apparatus 100 (the processing chamber 101), the film deposition on the substrates can be carried out continuously and effectively.

Further, for example, a configuration of a substrate processing apparatus 1000 can be variously modified or changed without being limited to the above-described one. For example, the transfer chamber 201 may not be necessarily connected with two film deposition apparatuses 100 (the processing chambers 101), and may also be connected with, e.g., three or four film deposition apparatuses 100. Moreover, the transfer chamber 201 may be connected with an apparatus for performing substrate processing other than the film deposition apparatus 100. In this manner, the configuration of the substrate processing apparatus can be modified if necessary, and the efficiency of the substrate processing (film deposition) can be improved.

While the invention has been shown and described with respect to the embodiments, it will be understood by those skilled in the art that various changes and modification may be made without departing from the scope of the invention as defined in the following claims.

INDUSTRIAL APPLICABILITY

In accordance with the present invention, it is possible to provide a film deposition apparatus and method which can perform uniform film deposition by employing induction heating to decompose a film deposition gas having a high decomposition temperature.

This international application claims priority to Japanese Patent Application No. 2006-348458 filed on Dec. 25, 2006, the entire contents of which are incorporated herein by reference.

What is claimed is:

1. A film deposition apparatus comprising:
   a processing chamber having a vacuum space thereinside and to which a film deposition gas is supplied;
   a substrate supporting unit which is disposed in the vacuum space and serves to support a substrate;
   a coil unit which serves to inductively heat the substrate supporting unit and is divided into a plurality of coils; and
   a coil control unit which independently controls the coils, wherein the coil control unit includes a power control unit configured to separately apply a high frequency power to each of the coils;
   wherein the coils are arranged in accordance with a flow of the film deposition gas in the processing chamber;
   wherein the substrate supporting unit includes a mounting table for mounting thereon the substrate and a heating structure disposed around the mounting table to surround the mounting table, wherein the mounting table and the heating structure are inductively heated by the coil unit and the substrate is heated by radiant heat from the mounting table and the heating structure, wherein the heating structure has two openings disposed opposite to each other, so that the film deposition gas is supplied from one of the openings and exhausted through the other opening, wherein a heat insulating member supporting structure is provided in the processing chamber and divides the vacuum space into a film deposition gas supply space and a heat insulating space, wherein the film deposition gas is supplied into the film deposition gas supply space, and wherein a heat insulating member is provided in the heat insulating member supporting structure to be separated from a processing chamber wall and to surround the substrate supporting unit.

2. The film deposition apparatus of claim 1, further comprising temperature detectors installed at the substrate supporting unit to detect temperatures of the substrate supporting unit, wherein the coil control unit controls the coils based on the temperatures detected by the respective temperature detectors.

3. The film deposition apparatus of claim 1, wherein the coil control unit includes a timing control unit configured to control a timing of applying the high frequency power to each of the coils.

4. The film deposition apparatus of claim 1, wherein the coil control unit includes a frequency control unit configured to control a frequency of a high frequency power applied to each of the coils.

5. The film deposition apparatus of claim 1, wherein the vacuum space is partitioned into a first space to which the film deposition gas is supplied and a second space to which a cooling gas is supplied.

6. The film deposition apparatus of claim 1, wherein the mounting table is of a disc shape and is configured to be rotatable and mount thereon a plurality of substrates.

7. The film deposition apparatus of claim 1, wherein the power control unit is configured to set a power level of the high frequency power applied to a first coil of the coils to be higher than that applied to a second coil of the coils, and wherein the first coil is disposed at an upstream side of the flow and the second coil is disposed at a downstream side of the flow.

8. The film deposition apparatus of claim 1, wherein the heating structure has a cuboid shape having the openings at two opposite sides thereof.

9. The film deposition apparatus of claim 1, wherein a cooling gas is supplied to the heat insulating space.

10. A film deposition method comprising:
supplying a film deposition gas to a substrate supported by a substrate supporting unit installed inside a processing chamber; and
inductively heating the substrate supporting unit by separately applying a high frequency power to each of a plurality of induction heating coils;

wherein the coils are arranged in accordance with a flow of the film deposition gas in the processing chamber, wherein the substrate supporting unit includes a mounting table for mounting thereon the substrate and a heating structure disposed around the mounting table to surround the mounting table, wherein said inductively heating the substrate supporting unit includes inductively heating the mounting table and the heating structure and the substrate is heated by radiant heat from the mounting table and the heating structure, wherein the heating structure has two openings disposed opposite to each other, so that the film deposition gas is supplied from one of the openings and exhausted through the other opening, wherein a vacuum space formed inside the processing chamber is divided into a film deposition gas supply space and a heat insulating space by a heat insulating member supporting structure, wherein the film deposition gas is supplied into the film deposition gas supply space, and wherein a heat insulating member is provided in the heat insulating member supporting structure to be separated from a processing chamber wall and to surround the substrate supporting unit.

11. The film deposition method of claim 10, wherein the coils are controlled based on temperatures detected by temperature detectors installed at the substrate supporting unit.

12. The film deposition method of claim 10, wherein a timing of applying the high frequency power to each of the coils is controlled.

13. The film deposition method of claim 10, wherein a frequency of the high frequency power applied to each of the coils is controlled.

14. The film deposition method of claim 10, wherein a film mainly made of Si and C is formed on the substrate by using the film deposition gas.

15. The film deposition method of claim 14, wherein the film deposition gas includes a gas represented by $C_xH_y$, wherein x and y are integers.

16. The film deposition method of claim 10, wherein the substrate supporting unit is inductively heated to heat the substrate to a temperature higher than or equal to 1200° C.

17. The film deposition method of claim 10, wherein in said applying the high frequency power, a power level of the high frequency power applied to a first coil of the coils is set to be higher than that applied to a second coil of the coils, and wherein the first coil is disposed at an upstream side of the flow and the second coil is disposed at a downstream side of the flow.

18. The film deposition method of claim 10, wherein the heating structure has a cuboid shape having the openings at two opposite sides thereof.

19. The film deposition method of claim 10, wherein a cooling gas is supplied to the heat insulating space.

* * * * *

UNITED STATES PATENT AND TRADEMARK OFFICE
CERTIFICATE OF CORRECTION

PATENT NO. : 8,440,270 B2  Page 1 of 1
APPLICATION NO. : 12/521179
DATED : May 14, 2013
INVENTOR(S) : Morisaki et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 783 days.

Signed and Sealed this
Eighth Day of September, 2015

Michelle K. Lee
*Director of the United States Patent and Trademark Office*